United States Patent [19]

Boudou et al.

[11] Patent Number: 4,851,359

[45] Date of Patent: Jul. 25, 1989

[54] METHOD OF PRODUCING AN ELECTRICAL RESISTOR BY IMPLANTING A SEMICONDUCTOR MATERIAL WITH RARE GAS

[75] Inventors: Alain Boudou, Guerville; Brian Doyle, Paris; Jean-Claude Marchetaux, Montigny-le-Bretonneux, all of France

[73] Assignee: Bull S.A., Paris, France

[21] Appl. No.: 947,266

[22] Filed: Dec. 29, 1986

[30] Foreign Application Priority Data

Dec. 27, 1985 [FR] France ................................ 85 19344

[51] Int. Cl.[4] .......................................... H01L 21/265
[52] U.S. Cl. ....................................... 437/24; 437/918
[58] Field of Search ................................ 437/24, 918; 148/DIG. 136

[56] References Cited

U.S. PATENT DOCUMENTS

| | | | |
|---|---|---|---|
| 3,796,929 | 3/1974 | Nicholas et al. | 317/235 R |
| 3,925,106 | 12/1975 | Ku et al. | 437/24 |
| 4,035,925 | 10/1977 | Burr et al. | 357/64 |
| 4,110,776 | 8/1978 | Rao et al. | 357/23 |
| 4,432,008 | 2/1984 | Maltiel | 357/51 |

FOREIGN PATENT DOCUMENTS

| | | |
|---|---|---|
| 0068154 | 1/1983 | European Pat. Off. ............. 437/24 |
| 0107556 | 5/1984 | European Pat. Off. . |
| 0159408 | 10/1985 | European Pat. Off. . |
| 2117977 | 7/1972 | France . |
| 0027376 | 3/1978 | Japan ............................... 437/24 |
| 0122973 | 9/1979 | Japan ............................... 437/24 |

OTHER PUBLICATIONS

IBM Technical Disclosure Bulletin, vol. 24, No. 7A, Dec. 1981, pp. 3460–3461, Abbas et al.
Solid–State Electronics, vol. 19, No. 12, Dec. 1976, pp. 1021–1027, Wright, Kenneth et al.
Electronics, vol. 53, No. 1, Jun. 1980, pp. 39–40, Allan, Roger.

Primary Examiner—Olik Chaudhuri
Attorney, Agent, or Firm—Kerkam, Stowell, Kondracki & Clarke

[57] ABSTRACT

The invention enables precise and reliable adjustment of the resistance of a resistor formed in a zone (16) of monocrystalline semiconductor material (11) in spite of the presence of a density gradient of electrically active ions at the periphery of the zone, as a result of the implantation of ions of rare gases (+) in the zone. Furthermore, when the standard method of producing a resistor in a polycrystalline semiconductor material is used, implanting rare gas ions in the resistive zone enables precise and reliable adjustment of the resistance. The invention also maintains the dimensions of the initially resistive zone, despite later annealing, and is suitable for large-scale integration of circuits.

17 Claims, 1 Drawing Sheet

METHOD OF PRODUCING AN ELECTRICAL RESISTOR BY IMPLANTING A SEMICONDUCTOR MATERIAL WITH RARE GAS

FIELD OF THE INVENTION

The present invention relates to a method of producing an electrical resistor by doping a semiconductor material, and to the integrated circuit thereby produced, commonly called a chip. The invention also relates to the monocrystalline material comprising the substrate of the integrated circuit and to the polycrystalline semiconductor material currently included in the mesh network of the components of an integrated circuit.

BACKGROUND OF THE INVENTION

The formation of an electrical resistor by doping a zone of monocrystalline semiconductor material, such as, for example, silicon, differs depending on whether the material is initially doped or non-doped. Co-pending, commonly assigned U.S. Pat. application, Ser. No. 540,142 is a related application, and is a counterpart of issued European patent application No. 107,556.

The non-doped monocrystalline material comprises the substrate on which the integrated circuits are formed. A resistor is made in a zone of the substrate by doping it with electrically active ions that are capable of defining a type of conductivity, n or p, in the material. Similarly, electrically inactive ions, or atoms, are not capable of defining a type of conductivity in a semiconductor material. For silicon, the active ions are for example arsenic, phosphorus, or boron. The resistance depends on the concentration (density) of the active ions in the zone in accordance with a complex curve, which makes it difficult to adjust the resistance in a desired manner.

Furthermore, the substrate always undergoes at least one annealing operation subsequent to the formation of the resistor. Experience shows that annealing causes the active ions to diffuse in a practically anisotropic manner from the zone to its surrounding portions. The density of the ions, and consequently the resistance, thus undergo modification due to annealing. The magnitude of the change depends in particular on the temperature of annealing, on the initial density of the ions, and on the density gradient at the edge of the resistive zone. Since the peripheral portions of the resistive zone are not doped, the gradient is always relatively high. Furthermore, taking into account the many parameters involved, their own very variable effects and their complex influence on one another, it is impossible to adjust the resistance to the desired value within meaningful limits. Additionally, the diffusion notably increases the surface area of the initially doped zone and thus hinders larger-scale integration of the components of the substrate. In practice, this method of resistor formation does not provide any control over the resistance and so it is not used except in cases where the sole constraint is to limit the resistance.

The resistors found in the monocrystalline substrate of an integrated circuit are ordinarily resistive zones contained in the regions that have already been doped. Taking into account the relatively slight resistivity of an initially doped region, the method of producing a resistive zone in this region differs depending on whether its resistance is less than or greater than that of the doped region.

To obtain a smaller resistor, the resistive zone is doped strongly. Nevertheless, such a resistor must extend between two contacts so it can be inserted into an electrical circuit. In that case, the resistance of the region comes to be parallel to the intrinsic resistance of the resistive zone. The effective resistance of the zone then differs from its intrinsic resistance, as a function of the ratio between the intrinsic resistance of the zone and the resistance of the neighboring region of the substrate. To lessen the influence of the substrate resistance, the resistive zone is given a low resistance with respect to that of the substrate. Nevertheless, the strong concentrations of the dopants dictated by such a zone, along with the existence of strong density gradients on the edge of the zone, thus contribute to extensive diffusion of the ions from the initially doped zone to the surrounding region. This diffusion prevents any control over the method, even though such control is necessary, to adjust the low resistances correctly. One remedy is to change the type of conductivity of the ions between the zone and the region, in such as way as to insulate them with a p-n junction. However, the junction imposes relative voltage values, and if the nature of the ions is changed this still does not prevent their diffusion.

The production of a zone of higher resistance in an initially doped region is illustrated in U.S. Pat. No. 4,432,008. The resistive zone is placed on the surface of the region so that it is directly in contact with a conductor of the mesh network of the integrated circuit. In this manner, the resistive zone is located in series with the conductor and the conductive region. This accordingly necessitates a highly doped region within the monocrystal, such as the drain region of a field effect transistor, in the example chosen here. Yet the advantage is to have only one contact with the conductor, and that it is thus possible to reduce the surface area of the resistive zone around this sole contact.

To increase the resistance of the zone in the drain region of a transistor, it is known to introduce inactive dopants into the zone, which for silicon are gold, silver, zinc and copper. However, in practice it is found that all the inactive ions diffuse in the same manner as the active ions during an annealing operation. Further, to notably increase the resistivity of the zone relative to that of the region, a large quantity of inactive ions has to be introduced. The edge of the resistive zone will thus be the site of a marked density gradient. By way of example, for a silicon zone doped with gold ions having a coefficient of diffusion D of $10^{-10} cm^2/sec$, and having undergone annealing typically performed at a temperature of approximately 1000° C. for one-half hour, experience shows that the gold ions have diffused to a mean distance of approximately 4 micrometers (4 $\mu m$). Thus one finds the same disadvantages as those described above for the method of forming a resistive zone in the non-doped substrate. On the one hand, such diffusion prevents any effective, reliable adjustment of the resistance of the resistive zone. On the other, the diffusion considerably increases the dimensions of the initial resistive zone, and thus hinders large-scale integration of the components in the substrate. Furthermore, inactive ions emitted by the resistive zone and diffused into the neighboring region can contaminate functionally active sectors of the substrate, such as the sector located under the oxide film gate electrode of the field effect transistor, which includes the resistive zone in its drain as in the case of the above-cited U.S. patent. In that case, contamination is considered very deleterious to the transistor characteristics.

In view of the problems encountered in forming a resistor by introducing the inactive ions mentioned above, the aforenoted U.S. patent proposes increasing the resistance by creating defects in the crystalline lattice in the resistive zone. Unfortunately, experience shows that annealing does not allow any but a very small proportion of the initial defects to remain. Still, it is notable that this patent does not mention any examples of the resistances the described method is capable of creating.

Because of all the problems encountered in forming resistive zones in the monocrystalline substrate of an integrated circuit, they are currently inserted into the multilayer mesh network of components of the integrated circuit when the circuit includes a conductor layer made of a polycrystalline semiconductor material, typically silicon. For example, this kind of network is typically found in integrated circuits that include MOS-FET transistors (metal-oxide semiconductor field effect transistors), the gate electrodes of which are made of a polycrystalline semiconductor material. The step of producing these gate electrodes is taken advantage of to form the first level of the mesh network of components of the integrated circuit. The production of this first integrated level includes the deposition of a film of polycrystalline semiconductor material of uniform thickness, etching this film to etch in the connection elements there, and implanting a strong dose of active ions to make the connection elements conductive.

The formation of resistive zones in the polycrystalline connection elements is typically done by a standard method such as that described for example in the article by Ohzone et al., appearing in the journal "The Transaction of the IECE of Japan", Vol. E 63, Number 4, Apr. 1980, pages 267–274. According to this earlier method, an initial implantation of active ions in a small dose is made in all the non-doped polycrystalline semiconductor material. The dose is calculated to lower the resistivity of the non-doped material until reaching the value desired, to make resistors in the material. These resistors are thus defined within zones by masking of the initially doped material. Then a second ion implantation is done with a strong dose, to decrease the electrical resistance of the non-masked material, comprising the conductive portions of the film, considerably. Once the ion bombardment has altered the structure of the material, the material is annealed in order to restore the initial structure.

Nevertheless, even in a polycrystalline material, annealing still causes diffusion of the dopants in a practically anisotropic manner, similar to that of the dopants in monocrystalline material. In other words, the diffusion is dependent on the same parameters, such as the density gradient of the dopants, the nature of the dopants, and the annealing temperature. It also depends on the granulometry of the polycrystalline material, which promotes diffusion and makes it greater than that in the monocrystalline material. The resistive zones are thus encroached upon by the ions that are present in high dosage in the neighboring conductive regions, to the point that a zone having a small surface area becomes conductive and loses its role as a resistor, and that in a zone having a large surface area, only a central region will continue to have the desired resistivity. Diffusion thus hinders large-scale integration of the resistors in the polycrystalline material. At present, the desired resistive zones are squares on the order of 2 $\mu$m on a side, which are absolutely impossible to obtain using the earlier method. On the other hand, taking into account the many parameters associated with diffusion, their own effect in accordance with complicated functions and their complex influence on one another, the method does not enable mastery in adjusting the desired resistance of a resistive zone within meaningful limits. For example, experience shows that the resistance of polycrystalline silicon varies by a factor of from $10^4$ to $10^6$, for an ion dose that varies by only a factor of 10.

The wide variation in resistance obtained by this method means that at present it cannot be used except for producing very high resistance, on the order of a gigohm or more. In such resistance ranges, variations on the order of a megohm are relatively inconsequential. Furthermore, such values correspond to part of the slight downward slope of the resistivity curve as a function of the ion doping. The integrated circuits that are associated with this earlier method of resistor production are in particular the static RAMs (random access memories) of the MOS type.

The above-cited U.S. Pat. No. 4,432,008 discloses the formation of a resistor in a zone of polycrystalline semiconductor material by uniformly doping the material with active ions and implanting inactive ions in this zone that are identical to those discussed above with respect to the monocrystalline substrate. However, for the same reasons as above, experience shows that the proposed dopants still diffuse into the polycrystalline material, because of its granular structure. These dopants are thus unable to provide sufficient control for meaningful adjustment of the desired resistance of the resistive zones. On the other hand, the proposed combination of inactive ions with the formation of defects in the polycrystalline material proves by experimentation to be without any substantial effect, because the annealing process virtually restores the initial granulometry of the polycrystalline material. The resistivity values of the resistive zones are thus quite close to the resistivity of the material.

An efficacious solution has been furnished by the assignee of the present application in its the aforementioned European patent application No. 107,556. In brief, a resistor is formed in a zone of polycrystalline material by doping with a strong dose of active ions and by implanting ions of the family of rare gases in a quantity and with an energy sufficient to attain the desired resistivity. With this method, resistors having a very small surface area can be reliably and precisely obtained, within a range on the order of from 250 ohms to approximately 25 kilohms.

This invention was also conceived with the idea of eliminating the density gradient of the electrically active ions that previously existed between the zones and the neighboring conductive portions. This elimination is effected by a uniform doping with a strong dose of active ions in all of the polycrystalline material. In this context, it is estimated that the action of the rare gases in a resistive zone was that of the inactive ions mentioned in the above-cited U. S. patent, and that their improved efficacy with respect to other inactive ions was due to better synergy with the active ions introduced in a strong dose into the resistive zones in order to eliminate the ion density gradient. Because of this elimination, the method is limited to producing low resistance values, because of the strong dose of active ions. For example, experience using argon under the conditions described in the European patent show that the method is limited to making resistors that are precisely adjusted within a range of on the order of 250 ohms to 25 kilohms. In other words, while the standard method cannot be used except for very high resistance, the improved method cannot be used except for very low resistance, and cannot cover the range of resistances in between. Moreover, if it were possible to make intermediate resistors precisely and in a small size, it would be possible to realize new types of integrated circuits responsive to user demands.

In summary, technology is at present faced with the problem of producing a resistor in a zone of monocrystalline or polycrystalline material, whether doped or not. Only the formation of low resistance in a strongly doped polycrystalline semiconductor material has been mastered. This problem is substantially due to the diffusion of the resistive doping ions during annealing. The resultant disadvantages are mainly the lack of control the methods provide in adjusting a resistor to the value desired within narrow tolerances, and the necessity of working with resistors of large dimension, which is incompatible with the very large-scale integration that is desired. An additional problem, in certain cases, is the contamination of the resistive doping ions in functionally sensitive sectors of the substrate, and the alteration of the characteristics of the contaminated components.

OBJECT AND SUMMARY OF THE INVENTION

The present invention solves this general problem by notably reducing, or eliminating, diffusion of the resistive doping ions during annealing. As a consequence, it avoids all the disadvantages of the prior art methods.

The method according to the invention for producing a resistor in a zone of semiconductor material by implanting electrically inactive ions is characterized in that the periphery of the zone is the site of a gradient of electrically active ions, and the inactive ions are ions of rare gases.

As a corollary, an integrated circuit according to the invention including a semiconductor material incorporating a resistive zone containing electrically inactive ions is characterized in that the periphery of the zone is the site of a gradient of electrically active ions, and the electrically inactive ions are ions of rare gases.

The invention will now be described in detail, in terms of exemplary embodiments shown in the accompanying drawings.

DESCRIPTION OF THE PREFERRED EMBODIMENTS

Figure 1:
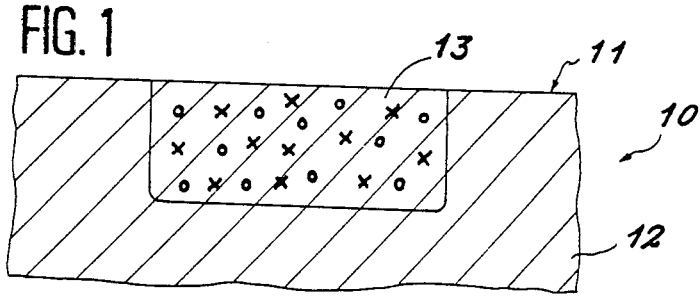
FIG. 1 is a fragmentary sectional view of the monocrystalline substrate of an integrated circuit including a resistor according to the invention.

According to the present invention, in the integrated circuit 10 shown particularly in FIG. 1, the substrate 11 of monocrystalline semiconductor material incorporates, on the surface of a non-doped region 12, a zone 13 comprising a resistor according to the invention. The resistive zone 13 contains active ions, for example of arsenic, symbolized by dots, and inactive ions, represented by crosses. The periphery of the zone 13 is thus the site of a density gradient of active ions. According to the invention, the inactive ions are ions of rare gases. Argon is advantageous, because of the fact of its performance and its low cost. Knowing that the presence of active ions lessens the resistance of the semiconductor material, and that the presence of inactive ions increases its resistance, the active ions are introduced in a dose much higher than that required to give them the desired resistance. The resistance is adjusted by implanting ions of rare gases, in particular as a function of the density of these ions and of their energy of implantation. Generally, the implantation of rare gases is temporally independent of the introduction of the active ions. In other words, it may be done before, during or after the introduction of active ions, provided that their annealing comes later. The doping of active ions may thus be done by diffusion or by ion implantation.

Experience has in fact revealed specific properties of the rare gases as compared with other inactive ions, such as those proposed in the above-cited U. S. patent. Briefly, the rare gas ions that are implanted have the particular property of preventing, at the high temperatures of annealing, both the restoration of the structure of the semiconductor material and and the diffusion of both the active ions and the rare gas ions. The absence of diffusion of the active ions and the rare gas ions has the advantage of enabling adjustment of the resistance, independently of any ion density gradient at the periphery of the resistive zone. It also has the advantage of keeping the resistive zone within its original dimensions, which may then be very much reduced (for example 2 $\mu m$ on a side) and can thus be adapted to very large scale integration. It also eliminates any contamination of surrounding sectors by ions emitted by the resistive zone. On the other hand, the fact that the rare gas ions prevent the restoration of the semiconductor material structure that the ion implantation has dislocated affords the advantage of being able to substantially modify the resistance of the material, in a controlled manner. Experience shows that this fact now explains the advantages stated in the above-cited European patent application.

Figure 2:
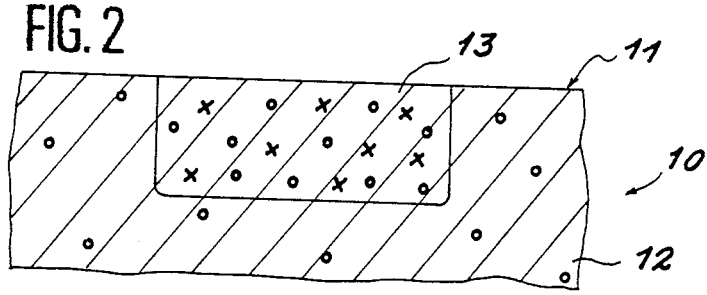
FIG. 2 is a view similar to that of FIG. 1, showing a variant embodiment of a resistor according to the invention in the monocrystalline semiconductor substrate of an integrated circuit.

In the integrated circuit 10 shown in part in FIG. 2, the region 12 and the resistive zone 13 of the monocrystalline substrate 11 are initially uniformly doped with active ions. According to the invention, the zone 13 containing supplementary active ions, causing the periphery of the zone to be the site of a density gradient of active ions, and also contains inactive ions such as argon. The ions in the zone 13 increase its resistivity as a function of their density and their energy of implantation and they enable adjusting the resistance. Once again, the implantation of rare gas ions is temporally independent of the introduction of active ions, as long as their annealing occurs later.

Figure 3:
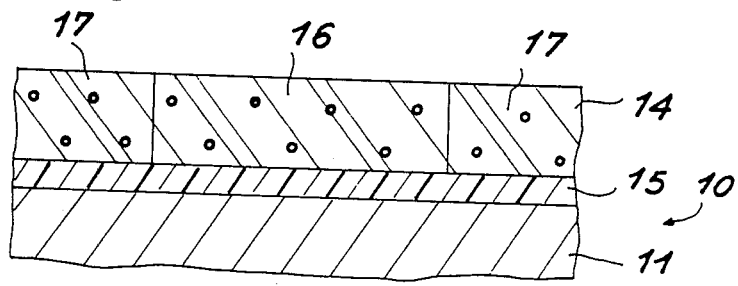
FIGS. 3 and 4 show the method according to the invention for producing a resistor in a polycrystalline semiconductor material.
Figure 4:
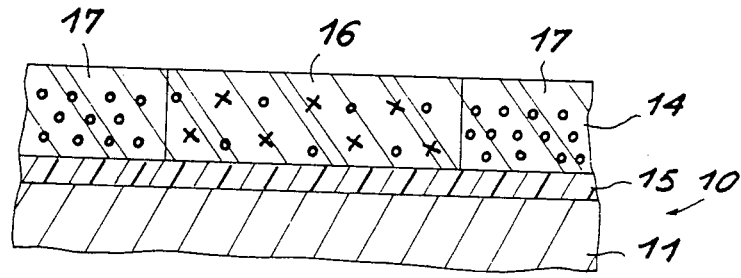

Referring now to FIGS. 3 and 4, the monocrystalline substrate 11 of the integrated circuit 10 supports a layer 14 of polycrystalline semiconductor material via an intermediate insulating layer 15. The layer 14 includes a zone 16 comprising a resistor according to the invention, and a remaining conductive portion 17. The method according to the invention for producing a resistor in the zone 16 makes it possible to use the method classically used to form a resistor in a polycrystalline material, despite the presence of a strong gradient of active ion density at the periphery of the zone 16. In the layer 14 that is initially non-doped, active ions are implanted uniformly in a low dose, as shown in FIG. 3. Then, after masking of the zone 16, the active ions are implanted in a high dose in the remaining portion 17 of the layer to make it conductive, as shown in FIG. 4. According to the invention, ions of rare gases, such as argon, are also implanted in the zone 16. The initial implantation with a low dose of active ions is thus done taking into account in particular the density of the rare gas ions and their energy of implantation, so as to adjust the resistance to the desired value. The implantation of rare gas ions is temporally independent of the initial uniform doping with active ions, and again may be done after the doping with a high dose in the remaining portion 17, as long as the annealing takes place later. The polycrystalline semiconductor material may be silicon, or a composite semiconductor material having a refractory material, such as tungsten silicide, $WSi_2$.

What is claimed is:

1. A method of forming a resistor having a predetermined resistance value in a zone of a region of undoped monocrystalline semiconductor material, comprising the steps of defining said zone within the region by doping the zone with electrically active ions of a predetermined conductivity type to provide the zone with a resistance value which is lower than said predetermined resistance value by a controlled resistance deviation, implanting in the zone electrically inactive ions of a rare gas with a controlled magnitude to compensate for said resistance deviation and to afford said predetermined resistance, and annealing the region.

2. A method according to claim 1, wherein said step of implanting electrically inactive ions includes controlling the density and energy of implantation of the inactive ions to afford said controlled magnitude to compensate for said resistance deviation.

3. A method according to claim 1, wherein the steps of doping and implanting are made prior to the step of annealing, and are temporally independent of each other.

4. A method according to claim 3, wherein said step of doping comprises a diffusion.

5. A method according to claim 3, wherein said step of doping comprises an implantation.

6. A method of forming a resistor having a predetermined resistance value in a zone of a region of monocrystalline semiconductor material which is uniformly doped with electrically active ions of a predetermined conductivity type, comprising the steps of defining said zone within the region by doping the zone with additional electrically active ions of said conductivity type to provide the zone with a resistance value which is lower than said predetermined resistance value by a controlled resistance deviation, implanting in the zone electrically inactive ions of a rare gas with a controlled magnitude to compensate for said resistance deviation and to produce said predetermined resistance value, and annealing the material.

7. A method according to claim 6, wherein said step of implanting electrically inactive ions comprises controlling the density and the energy of implantation of the inactive ions to afford said controlled magnitude to compensate for said resistance deviation.

8. A method according to claim 6, wherein the steps of doping and implanting are performed prior to the step of annealing, and are temporally independent of each other.

9. A method according to claim 8, wherein said step of doping comprises a diffusion.

10. A method according to claim 8, wherein said step of doping comprises an implantation.

11. A method of forming a resistor having a predetermined resistance value in a zone of a region of semiconductor material, comprising the steps of uniformly doping the region with electrically active ions of a predetermined conductivity type to provide the region with a resistance value which is lower than said predetermined resistance value by a controlled resistance deviation, defining said zone within the region by implanting in the zone electrically inactive ions of a rare gas with a controlled magnitude to compensate for said resistance deviation, masking said zone, doping the region with additional electrically active ions of said predetermined conductivity type, and annealing the region to afford said predetermined resistance value in the zone.

12. A method according to claim 11, wherein said step of implanting electrically inactive ions includes controlling the density and energy of implantation of the inactive ions to afford said controlled magnitude to compensate for said resistance deviation.

13. A method according to claim 11, wherein said semiconductor material is a monocrystalline material.

14. A method according to claim 11, wherein said semiconductor material is a polycrystalline material.

15. A method according to claim 11, wherein said steps of doping and implanting are performed prior to said step of annealing and are temporally independent of each other.

16. A method according to claim 11, wherein said doping comprises a diffusion.

17. A method according to claim 11, wherein said doping comprises an implantation.

* * * * *